United States Patent [19]

Kaetsu et al.

[11] Patent Number: 5,273,463
[45] Date of Patent: Dec. 28, 1993

[54] TEST CONNECTOR FOR ELECTRONIC CIRCUIT UNITS

[75] Inventors: Mitsuo Kaetsu; Kiyoshi Minematsu; Hiroshi Yamaji; Tomoyuki Hongoh, all of Kawasaki, Japan

[73] Assignee: Fujitsu Limited, Kawasaki, Japan

[21] Appl. No.: 854,627

[22] PCT Filed: Oct. 16, 1991

[86] PCT No.: PCT/JP91/01411

§ 371 Date: Jun. 9, 1992

§ 102(e) Date: Jun. 9, 1992

[30] Foreign Application Priority Data

Oct. 17, 1990 [JP] Japan ................... 2-276311

[51] Int. Cl.⁵ .......................................... H01R 13/64
[52] U.S. Cl. ..................................... 439/681; 439/680
[58] Field of Search ............... 439/59, 61, 62, 633, 439/680, 681, 912; 324/158 F

[56] References Cited

U.S. PATENT DOCUMENTS 2,968,019 1/1961 Steinman et al. ................... 439/633
3,364,458 1/1968 Black, Jr. et al. .................. 439/633

FOREIGN PATENT DOCUMENTS 63-195792 12/1988 Japan .
1-179491 12/1989 Japan .

OTHER PUBLICATIONS

IBM Technical Disclosure, Benjamin et al. vol. 2, No. 1, p. 44, Jun. 1959.

Primary Examiner—Neil Abrams
Attorney, Agent, or Firm—Staas & Halsey

[57] ABSTRACT

A test connector for an electronic circuit unit to be mounted on a shelf (11) of an electronic apparatus, which is adapted to be inserted on the shelf only when a projection (33) on the electronic circuit unit comes into a matching position relative to a groove (25) provided on a frame portion (21) of the shelf (11). Guide members (51, 53) with guide grooves (55, 65) which guide the opposite side edges of the electronic circuit unit (27) are provided on a printed wiring board (45) which has connectors (47, 49) at the opposite ends thereof. A plurality of rod members (61, 63) are slidably located on the guide member (51). When mounting the electronic circuit unit, at least one of the rod members (61) or (63) is slid forwardly by the projection (33), prohibiting the placement of the test connector (43) on the shelf (11) unless a protruded end of the rod member (63) is in a matching position relative to the groove (25) on the shelf (11).

8 Claims, 13 Drawing Sheets

TEST CONNECTOR FOR ELECTRONIC CIRCUIT UNITS

TECHNICAL FIELD

This invention relates to a test connector to be applied to an electronic apparatus having a plural number of electronic circuit units mounted on a shelf, for the purpose of positioning electronic circuit units outside the shelf while electrically connecting them to the main frame of the electronic apparatus.

BACKGROUND ART

In electronic apparatus such as electronic computers, electronic exchangers and the like, the following construction is widely adopted from the standpoint of maintenance or installation of optional circuits. Namely, an electronic apparatus is constituted by a plural number of electronic circuit units, each having a plural number of electronic devices like IC's and LSI's collectively mounted on a printed wiring board. Each of the electronic circuit units is mounted on a shelf with a backboard by the use of a plug-in type connector to facilitate replacement of the electronic circuit units or installation of additional or optional circuit units.

In an electronic apparatus constructed in the above-described manner, the respective electronic circuit units have to be inserted into correct positions on a shelf according to unit types because a misplaced unit is likely to cause troubles. Therefore, it is the general practice to provide an anti-misplacement mechanism which mechanically prevents an electronic circuit unit from being mounted in a false position.

For example, Japanese Laid-Open Patent Application 1-198098 discloses an anti-misplacement mechanism of this sort, as explained below with reference to FIG. 1.

In this figure, the reference numeral 11 denotes a shelf which is fixedly supported on a pair of posts 13. Fixed to the back side of the shelf 11 is a backboard 17 which is provided with a plural number of connectors 15 on the inner side thereof, along with a plural number of paired upper and lower guide grooves 19 on the ceiling and bottom sides of the shelf 11 to guide electronic circuit units therealong. A frame member 21 with an opening is provided on the front side of the shelf 11. The frame member 21 is provided with unit insertion grooves 23 in frame portions on the upper and lower sides of the opening correspondingly and contiguously to the guide grooves 19. Further, anti-misplacement grooves 25 are provided on the frame portion on the upper side of the opening correspondingly to the respective unit insertion grooves 23.

The reference 27 denotes an electronic circuit unit which has a plural number of electronic devices such as IC's, LSI's and the like collectively mounted on a printed wiring board. The electronic circuit unit 27 is provided with a connector 29 at one end thereof for coupling engagement with a connector 15 on the backboard 17, and with a surface plate 31 at the other end. The surface plate 31 is formed with an upwardly protruding anti-misplacement projection 33.

The electronic circuit unit 27 is inserted along the unit insertion groove 23 and guide groove 19 of a unit mounting position on the shelf until the connector 29 on the electronic circuit unit 27 is coupled with a corresponding connector 15 on the backboard 17.

The anti-misplacement grooves 25 formed in the frame member 21 of the shelf 11 and the anti-misplacement projection 33 formed on the surface plate 31 of the electronic circuit unit 27 function as follows. In this connection, it is the general practice to mount a plural number of electronic circuit units of different kinds or types on the shelf 11. Accordingly, there are possibilities of the electronic circuit units being mounted in positions other than actually intended positions. If the electronic apparatus is started in such a state, it becomes difficult to produce the intended functions of the apparatus, in addition to probabilities of troubles. The misplacement of this sort is prevented by the anti-misplacement grooves 25 on the frame member 21 in cooperation with the anti-misplacement projections 33 on the surface plates 31.

Namely, in a case where two kinds of electronic circuit units A and B are to be mounted on a shelf 11, the electronic circuit unit 27 of type A is provided with an anti-misplacement projection 33 at position A on the surface plate 31 as shown in the drawing, while the other electronic circuit unit 27 of type B is provided with an anti-misplacement projection at position B.

The spacing between the unit insertion groove 23, which corresponds to the mounting position of the electronic circuit unit 27 of type A, and the anti-misplacement groove 25 has the same dimension as the spacing between the printed wiring board of the electronic circuit unit 27 and the anti-misplacement projection 33 (at position A). Similarly, the spacing between the unit insertion groove 23, which corresponds to the mounting position of the electronic circuit unit 27 of type B, and the anti-misplacement groove 25 has the same dimension as the spacing between the printed wiring board of the type B electronic circuit unit 27 and the anti-misplacement projection 33 (at position B).

Where the dimension of the spacing between the unit insertion groove 23 and the anti-misplacement groove 25 as well as the dimension of the spacing between the printed wiring board of the electronic circuit unit 27 and the anti-misplacement projection 33 is suitably adjusted in this manner, the anti-misplacement projection 33 is allowed to pass through the anti-misplacement groove 25 as long as the electronic circuit unit 27 is of the correct type for that particular mounting position. Otherwise, namely, in case the electronic circuit unit 27 is of an incorrect type, the anti-misplacement projection 33 on the electronic circuit unit 27 is not allowed to pass through the anti-misplacement groove 25 and accordingly prevents insertion of the electronic circuit unit 27 into an incorrect mounting position.

Figure 2:
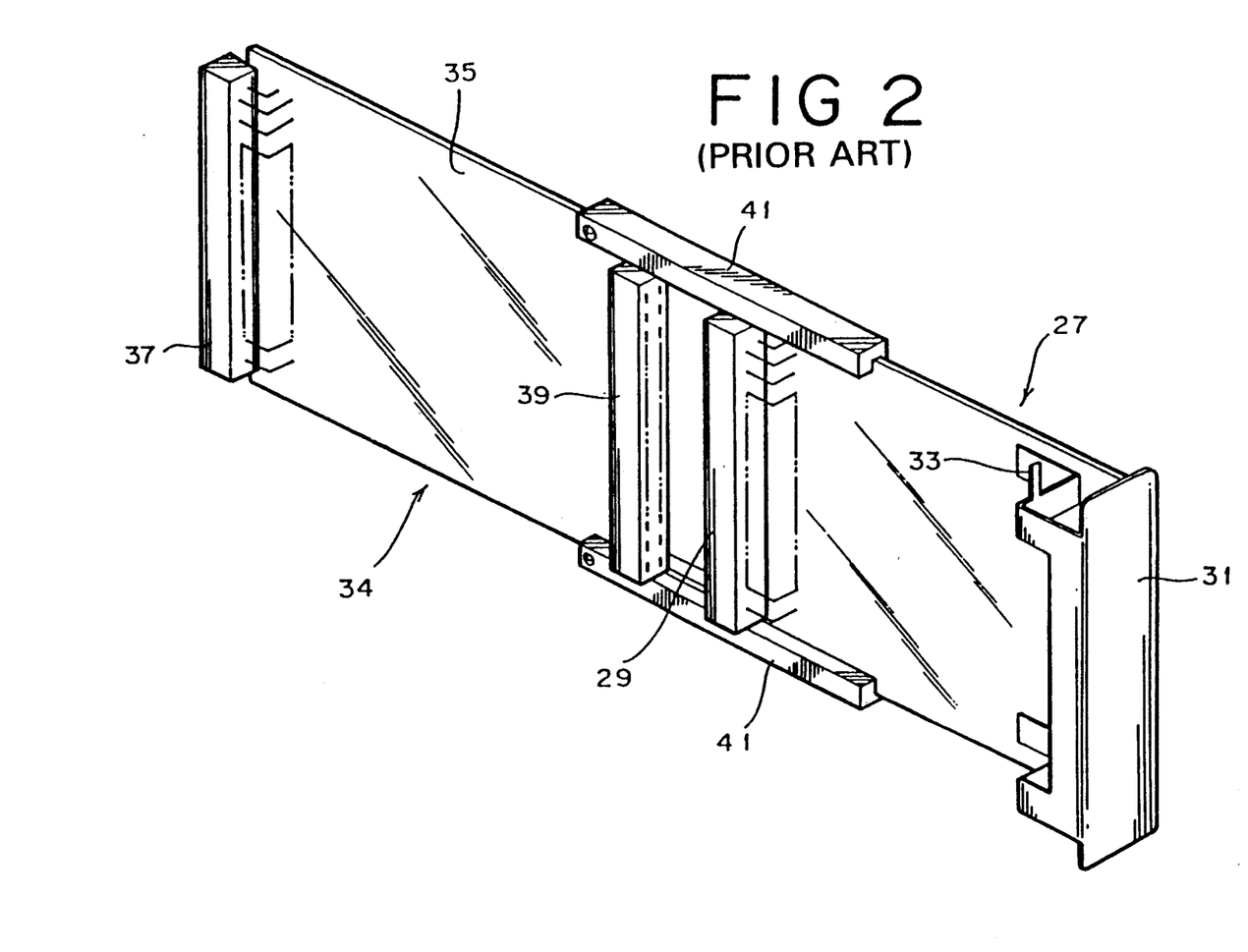
FIG. 2 is a perspective view of a conventional test connector.

On the other hand, with an electronic apparatus of this sort, there arises a necessity for electrically connecting the connector 29 of an electronic circuit unit 27, which is located outside the shelf 11, to a connector 15 on the backboard 17 by the use of a test connector. The test connector of this sort is known, for example, from Japanese Laid-Open Utility Model Application 61-165471, which is shown in FIG. 2.

Figure 1:
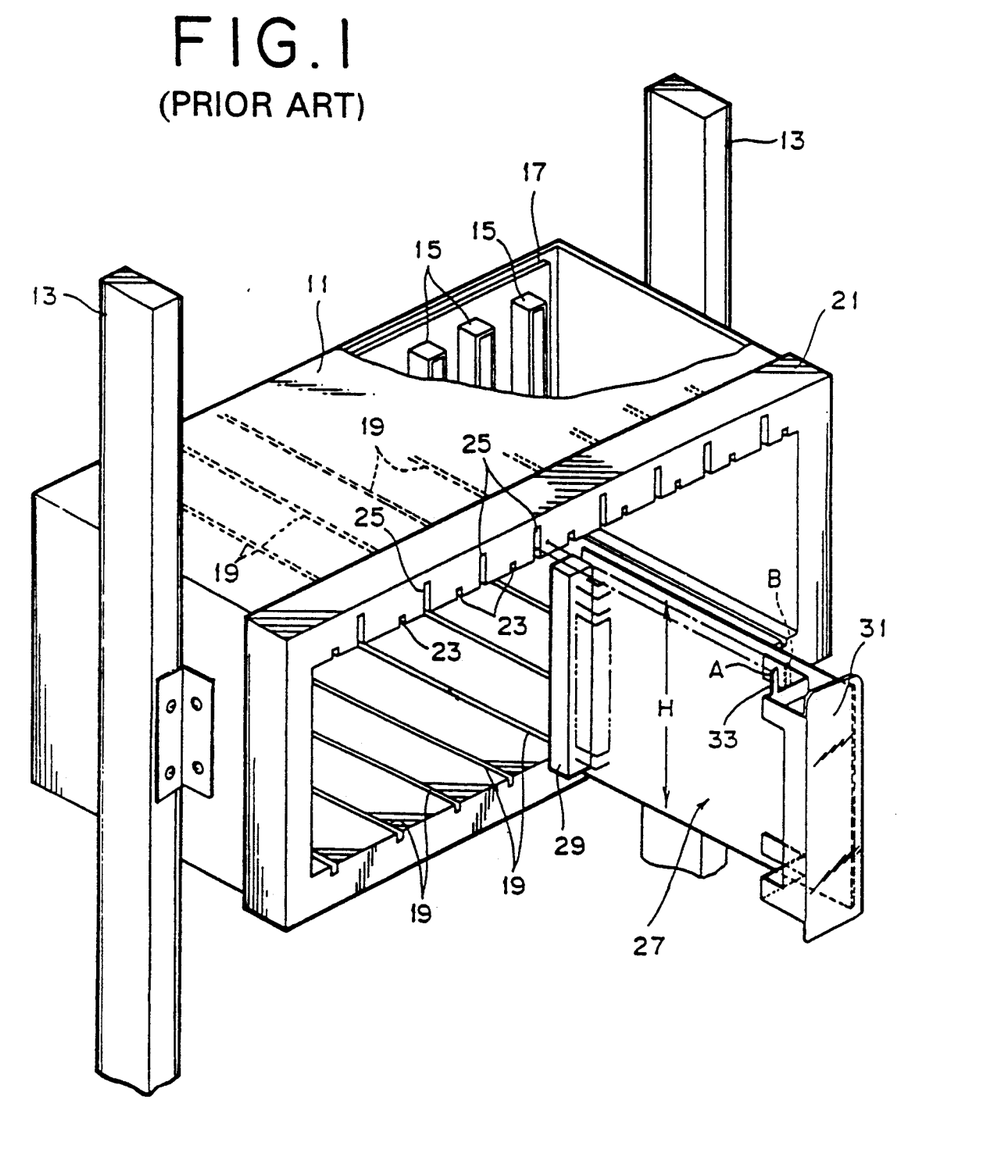
FIG. 1 is a schematic perspective view, showing the general arrange of a prior art electronic apparatus with an anti-misplacement mechanism.

In this figure, indicated at 34 is a test connector which has, at one end of a printed wiring board 35, a connector 37 to be coupled with the connector 15 on the backboard 17 shown in FIG. 1 and, at the other end of the printed wiring board, a connector 39 to be coupled with the connector 29 of the electronic circuit unit 27. Projectingly extended from the opposite side edges at the other end of the test connector 34, with the connector 39, are a pair of guide members 41 which are each provided with a guide groove to guide the opposite side edges of the electronic circuit unit 27.

The test connector 34 is placed in a predetermined position on the shelf 11, and then the electronic circuit unit 27 is inserted along the guide members 41 of the test connector 39 until the connector 29 is coupled with the connector 39 thereby to electrically couple the electronic circuit unit 27, which is projected from the shelf 11, with the backboard 17. In this state, tests are carried out to check the conditions of the electronic devices which are mounted on the electronic circuit unit 27.

In the direction of insertion or extraction into or out of the shelf 11, the printed wiring board 35 of the test connector 34 is so dimensioned as to prevent the guide members 41 from hitting against the frame member 21 of the shelf 11 when the test connector is mounted thereon.

However, the conventional test connectors have no measures for preventing misplacement, so that they have the possibility of damaging the electronic apparatus by connecting a test connector having an electronic circuit unit of a false type or damaging a connector by inserting a test connector of a different type which does not match the connector on the backboard.

Therefore, it is an object of the present invention to provide a test connector which can overcome the above-mentioned drawbacks of the conventional test connectors, preventing electric troubles which might be caused by incorrect connection of electronic circuit units when testing an electronic apparatus, as well as mechanical damages which might result from misplacement of a test connector.

SUMMARY OF THE INVENTION

In accordance with the present invention, there is provided a test connector, comprising a board adapted to be inserted along guide grooves on a shelf; a connector attached to one end of the board for coupling engagement with a connector on the shelf; a connector attached to the other end of the board for coupling engagement with a connector on an electronic circuit unit; a pair of guide members each having a guide groove to guide the opposite side portions of the electronic circuit unit, the guide members being attached to the board in the vicinity of the other end thereof; and a plurality of rod members slidably provided in the vicinity of and substantially in parallel relation with the guide groove on a guide member.

As an electronic circuit unit is inserted along the guide grooves on the guide members, a projection on the electronic circuit unit is pressed against one end of part of the rod members, causing the corresponding rod member to slide back and to protrude the other end thereof out of the guide groove.

The information concerning the type of the electronic circuit unit, which is expressed by the projection on the electronic circuit unit in positional relation with the groove on the shelf, is thus reflected by the end of the rod member which is protruded as a result of the sliding movement. Accordingly, when mounting a test connector, which has an electronic circuit unit coupled therewith, its insertion into the shelf is prohibited unless there is matching between relative positions of the protruded end of the rod member and the groove on the shelf.

Consequently, it becomes possible to preclude electrical and mechanical troubles which might otherwise take place in the testing stage. If desired, a plurality of rod members may be provided along only one of the paired guide members. Alternatively, one or more rod members may be provided along each one of the paired guide members.

Where the test connector alone is mounted on a shelf with connectors of a different type, the above-described improved test connector construction might cause damage to the connectors and associated parts when the connector member on the test connector does not match a connector on the backboard.

To cope with such a problem, the improved test connector of the above construction is preferred to have a selective fixation means for fixing one or more of the rod members in a protruded state. Misplacement of the test connector on the shelf can be prevented by selectively fixing the rod member or members in certain positional relationship with the grooves on the shelf.

BEST MODE FOR CARRYING OUT THE INVENTION

Hereafter, the test connector according to the present invention, which is applicable to an electronic apparatus as shown in FIG. 1, is described in greater detail with reference to the accompanying drawings.

Figure 3:
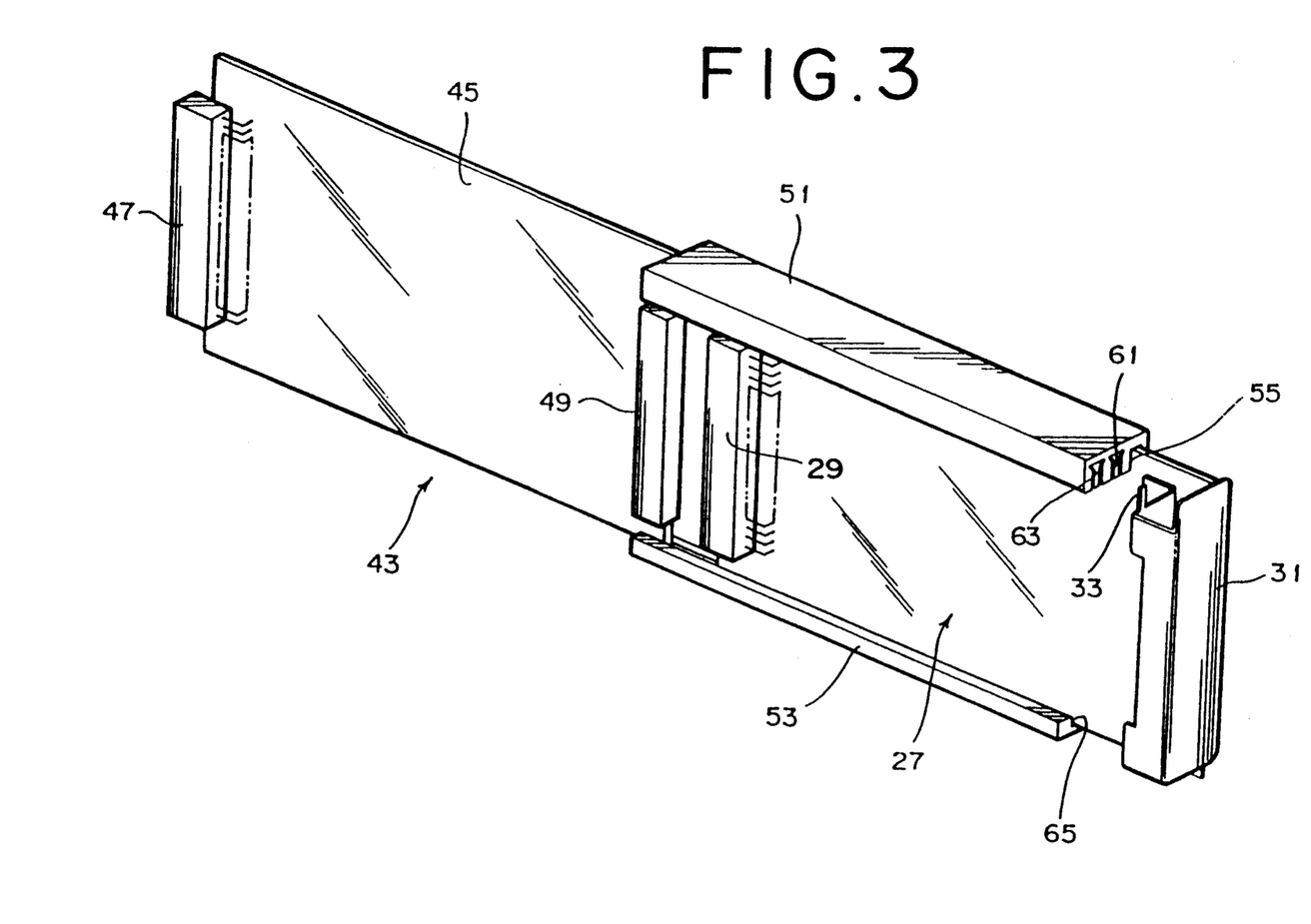
FIG. 3 is a perspective view of a test connector in an embodiment of the present invention.

Referring to FIGS. 3 through 9, there is schematically shown a test connector embodying the present invention. FIG. 3 is a perspective view illustrative of the general arrangement and in which the reference numeral 43 denotes the test connector according to the invention. The test connector 43 has a connector member 47 located at one end of a printed wiring board 45 for coupling engagement with the connector member 15 on the backboard 17 of the shelf 11 shown in FIG. 1, and has another connector member 49 located at the other end of the printed wiring board for coupling engagement with the connector member 29 on the electronic circuit unit 27. Further, a pair of guide members 51 and 53 are located along the opposite side edges of the printed wiring board 45 at the end with the connector member 49.

Figures 4, 5:
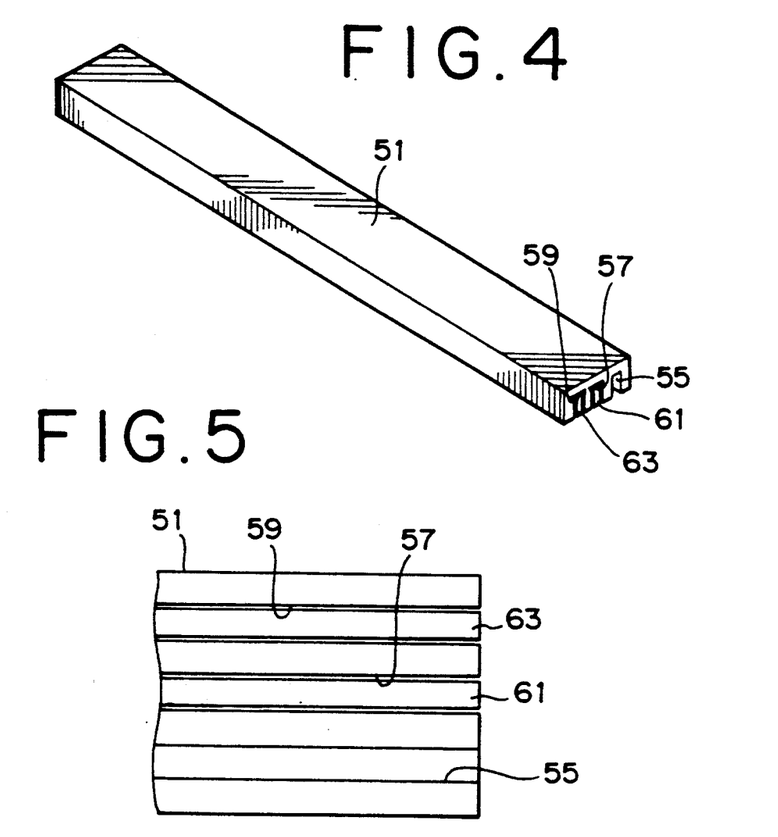
FIG. 4 is a perspective view of a guide member employed in the present invention.
FIG. 5 is an enlarged bottom view of the guide member of FIG. 4.
Figure 6:
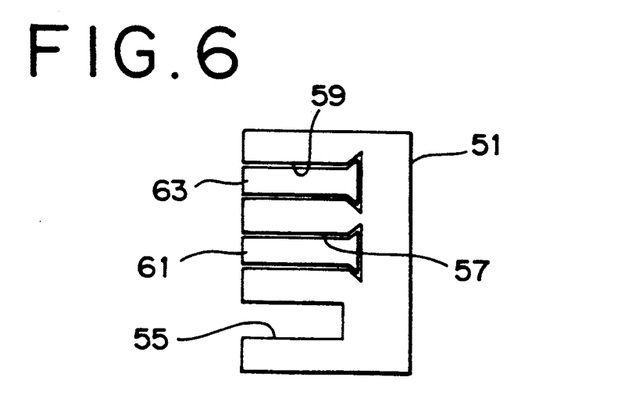
FIG. 6 is an enlarged side view of the guide member of FIG. 4.

As shown schematically in FIGS. 4 to 6, one guide member 51 is formed with a guide groove 55 longitudinally along its length to guide one side edge of the electronic circuit unit 27, along with a couple of grooves 57 and 59 which are formed substantially in parallel relation with the guide groove 55. Coextensive rod members 61 and 63 are slidably and extractably inserted in the grooves 57 and 59. The grooves 57 and 59 are slightly broadened in deeper portions correspondingly to the rod members 61 and 63 which are forwardly broadened in a slight degree to prevent them from falling off.

Figures 7, 8:
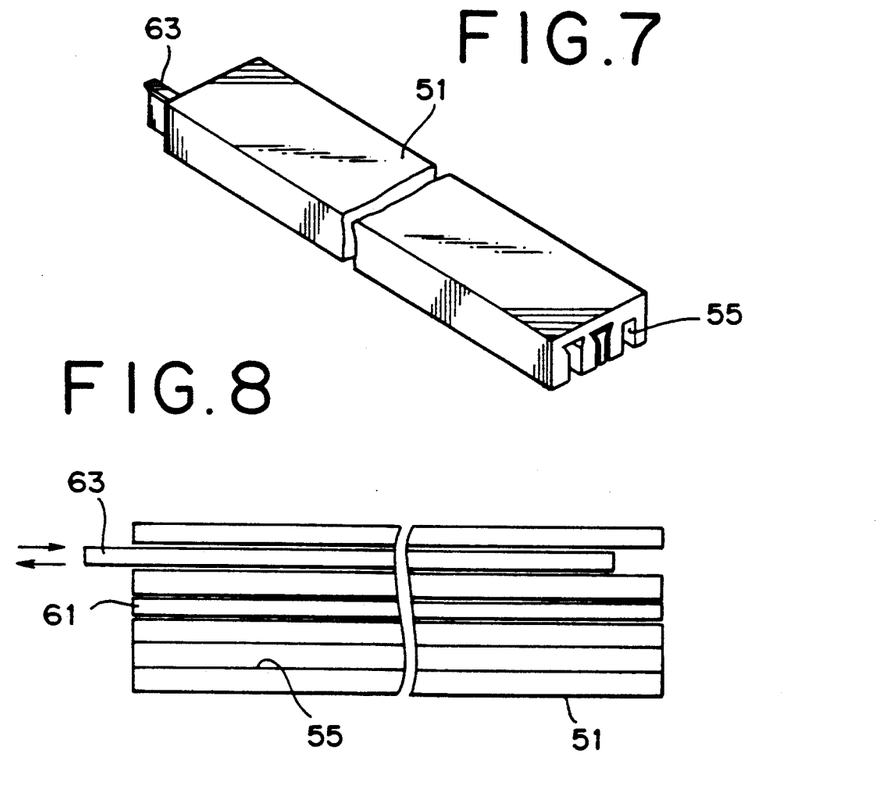
FIG. 7 is a perspective view explanatory of the functions of the guide members according to the invention.
FIG. 8 is a bottom view explanatory of the functions of the guide members of the present invention.

The dimensions of the spacings which separate the guide groove 55 from the two rod members 61 and 63 are determined according to the type of the electronic circuit unit to be used (e.g., according to the type of the electronic circuitry or mechanical design of the connector), in conformity with the dimension of the spacing between the printed wiring board of the electronic circuit unit 27 and the projection 33 on the surface plate 31. As shown in FIGS. 7 and 8, when pushed at one end, the rod members 61 and 63 of the guide member 51 slide to protrude the other end out of the guide member 51.

Referring again to FIG. 3, the other guide member 53 is formed with a guide groove 65 longitudinally along the length thereof thereby to guide the other side edge of the electronic circuit unit 27. Although not shown, the guide members 51 and 53 are firmly fixed to the printed wiring board 45 by suitable fixation means.

Thus, when inserting the electronic circuit unit 27 together with the test connector 43 with which the electronic circuit unit 27 is coupled into the shelf 11, the anti-misplacement projection 33 on the surface plate 31 of the electronic circuit unit 27 comes into abutting engagement with the end face of the rod member 61 or 63 as the electronic circuit unit 27 is inserted along the guide grooves 55 and 65 of the paired guide members 51 and 53 of the test connector 43. Upon further insertion of the electronic circuit unit 27, the rod member (e.g., the rod member 63) which is in engagement with the projection 33 slides to protrude out of the end of the guide member 51, and the connector member 49 of the test connector 43 is coupled with the connector member 29 on the electronic circuit unit 27 to establish electric connection therebetween.

Figure 9:
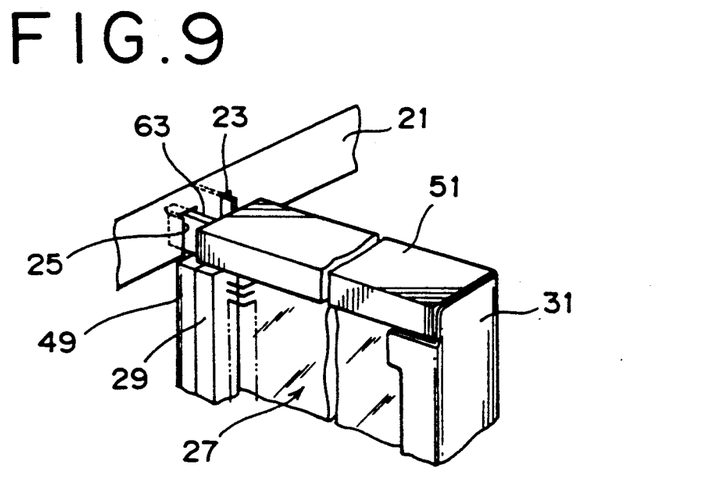
FIG. 9 is a perspective view of the test connector according to the invention, mounted on a shelf.

Next, the test connector 43, which is coupled with the electronic circuit unit 27, is inserted into the corresponding position on the shelf 11. By so doing, the opposite side edges of the printed wiring board 45 of the test connector 43 are guided along the guide grooves 19 to bring the protruded end of the rod member 63 on the guide member 51 to the vicinity of the frame member 21. In this instance, if the electronic circuit unit 27 on the test connector 43 is of the type to be mounted in the position where the test connector is currently inserted, the protruded end of the rod member 63 is allowed to pass through the anti-misplacement groove 25 on the frame member 21 as shown in FIG. 9 to couple the connector member 47 of the test connector 43 with the corresponding connector member 15 on the backboard 17, establishing electric connection therebetween to carry out necessary tests.

On the other hand, in case the electronic circuit unit 27 on the test connector 43 is not of the type to be mounted in the position where the test connector 43 is currently inserted, for example, in case the rod member 61 on the guide member 51 is in protruded state, the protruded end is not allowed to pass through the corresponding anti-misplacement groove 25 thereby prohibiting coupling of the connector member 47 on the test connector 43 with the connector member 15 on the backboard 17.

In this manner, the rod members 61 and 63 are provided on the guide member 51 of the test connector 43 correspondingly to the types of the electronic circuit units 27 to be used, so that either the rod member 61 or 63 is pushed out by the anti-misplacement projection 33 on the surface plate 31 of the electronic circuit unit 27, permitting coupling of the test connector 43 including the electronic circuit unit 27 only when the protruded end of the rod member 61 or 63 can pass through the anti-misplacement groove 25 on the frame member 21 of the shelf 11, and prohibiting placement of the test connector 43 on the shelf 11 when it is coupled with an electronic circuit unit of an incorrect type.

The foregoing description illustrates a case where the electronic circuit unit 27 is mounted on the test connector 43 prior to mounting the connector 43 on the shelf 11. However, in a case where all of the connector members on the shelf 11 are of one and same type, similar results can be obtained by inserting an electronic circuit unit 27 into the test connector 43 which has been mounted on the shelf 11 beforehand.

Further, in the foregoing embodiment, the guide member 51 is provided with two rod members to cope with two types of electronic circuit units 27. However, in case the test connector 43 is required to handle a greater variety of electronic circuit units 27, a corresponding number of rod members may be provided on the guide member 51 in a one-on-one fashion. The shape or the direction of the anti-misplacement projection may be arranged in a manner different from the above-described particular embodiment. For example, the projection may be formed in the direction of insertion or extraction of the electronic circuit unit 27. In such a case, instead of the rod members which are located in the grooves on the guide member, there may be employed cylindrical or round rod members which are fitted in longitudinal bores if desired.

Referring to FIGS. 10 through 18, there is shown another embodiment of the test connector according to the present invention.

Figure 10:
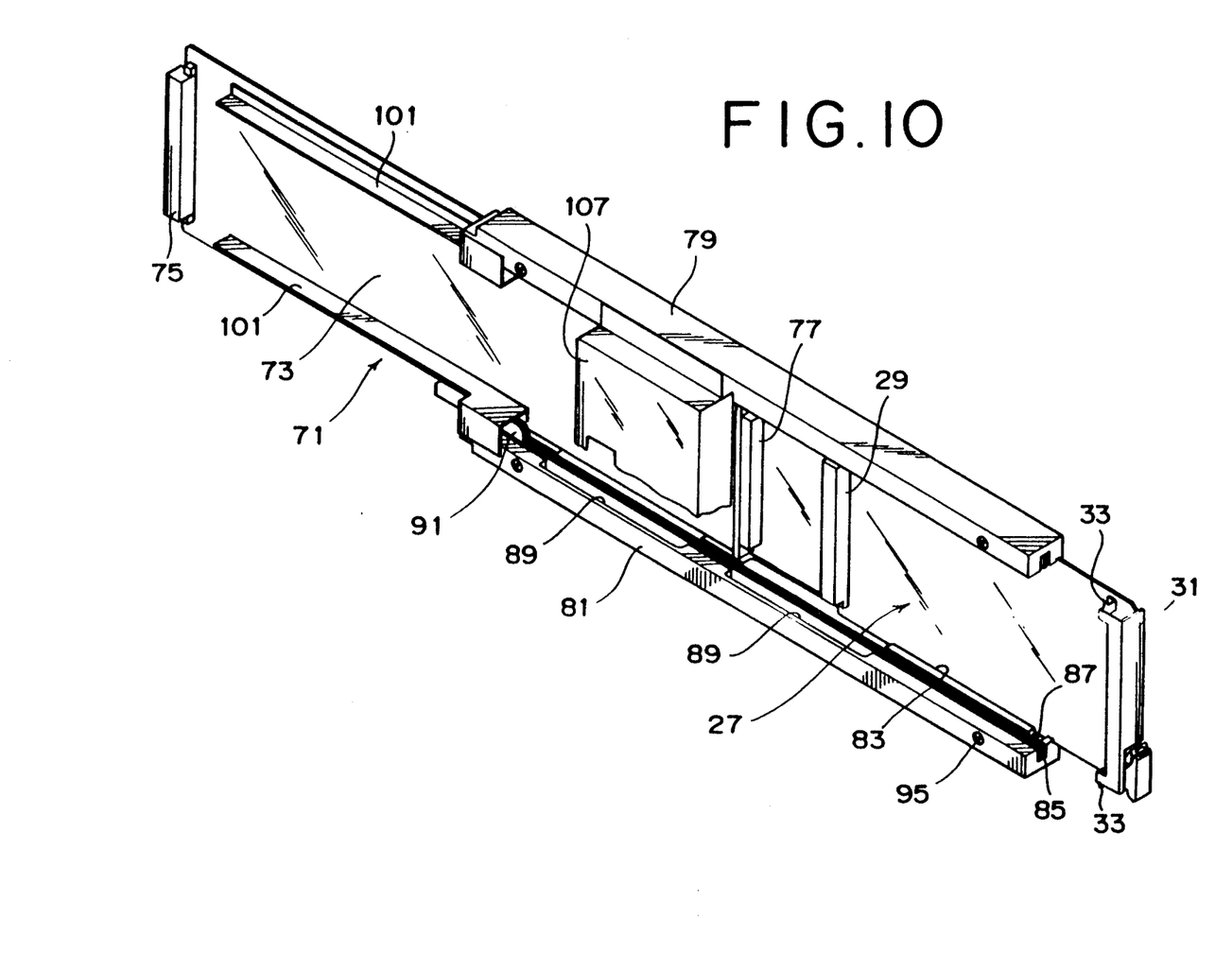
FIG. 10 is a perspective view of a test connector in another embodiment of the invention.
Figure 11:
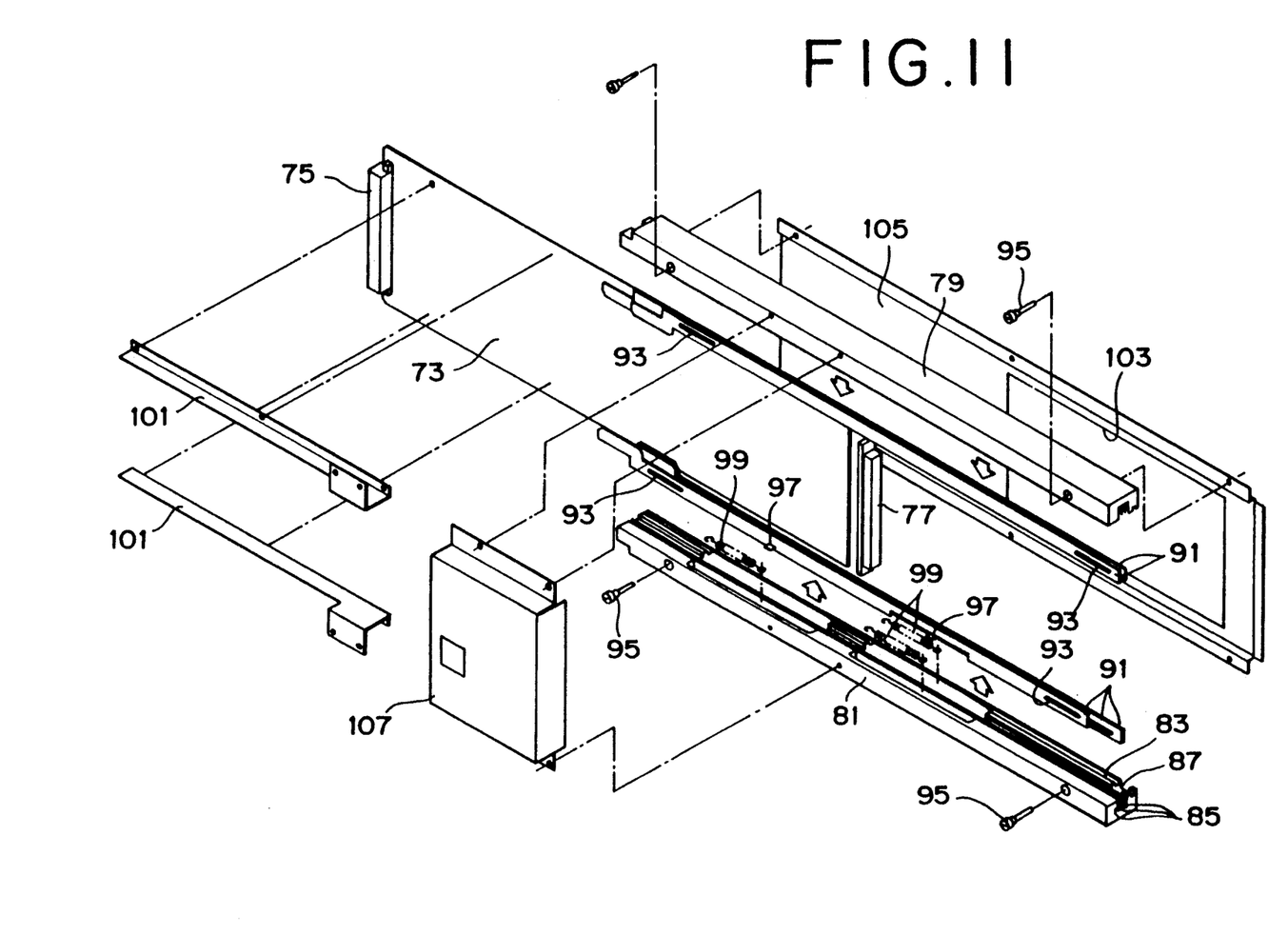
FIG. 11 is an exploded perspective view of the test connector of FIG. 10.

Reference is first made to the view of the general arrangement in FIG. 10 and the exploded perspective view in FIG. 11. In these figures, the reference 71 denotes a test connector according to the present invention, the test connector 71 having a connector member 75 located at one end of a printed wiring board 73 for coupling engagement with the connector member 15 on the backboard 17 of the shelf 11 as shown in FIG. 1. A connector member 77 is provided at the other end of printed wire board 73 for coupling engagement with the connector member 29 of an electronic circuit unit 27, along with a pair of guide members 79 and 81 which are provided in the vicinity of the opposite side edges at the other end of the printed wiring board 73.

Figure 12:
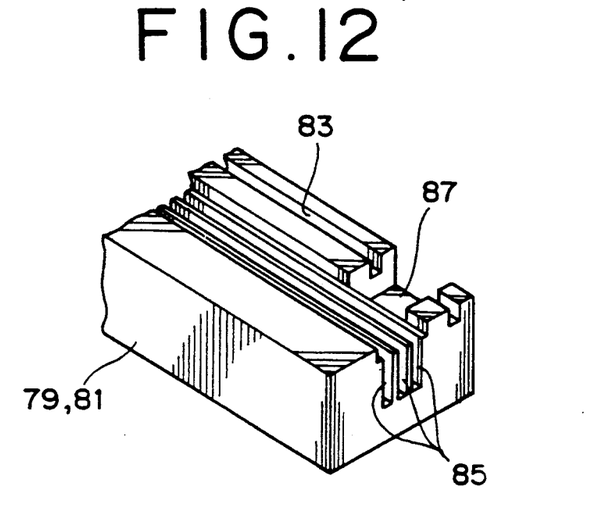
FIG. 12 is a fragmentary perspective view on an enlarged scale of a guide member according to a second embodiment of the invention.

As seen in the enlarged fragmentary view of FIG. 12, the guide members 79 and 81 are formed with guide grooves 83 longitudinally along the lengths thereof thereby to guide the printed wiring board 73 and the printed wiring board of the electronic circuit unit 27, and three grooves 85 which are formed substantially in parallel relation with the guide grooves 83. Each of the guide members 79 and 81 is provided with a notch 87 in a fore end portion, and with a spring receiving recess 89 in an intermediate portion thereof.

Slidably received in the grooves 85 on the guide members 79 and 81 are rod members 91 which have substantially the same length as the guide members 79 and 81.

Figure 13:
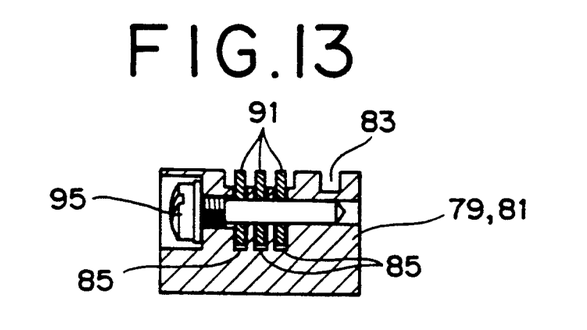
FIG. 13 is a cross-sectional view of a rod member support structure in the second embodiment of the invention.
Figure 14:
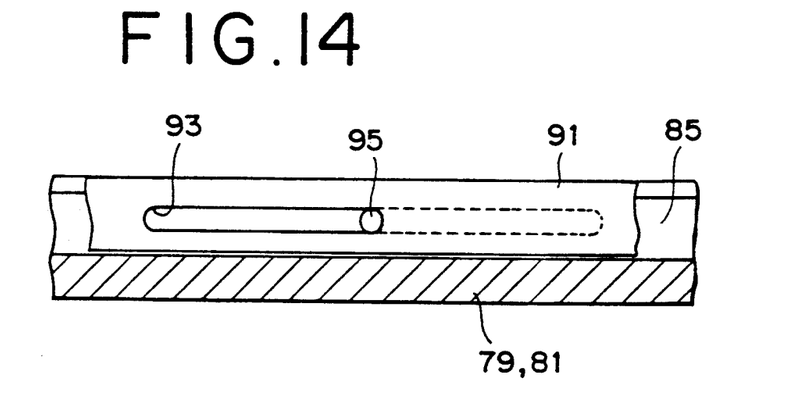
FIG. 14 is a longitudinal sectional view of the rod member support structure in the second embodiment of the invention.
Figure 15:
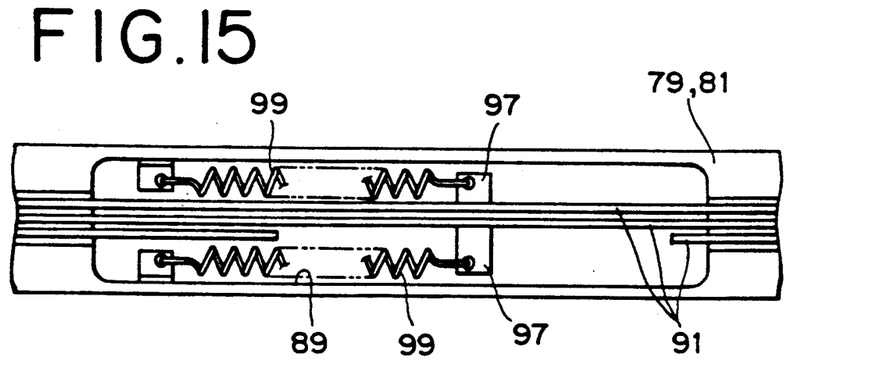
FIG. 15 is a plan view of a rod member biasing means in the second embodiment of the invention.
Figure 16:
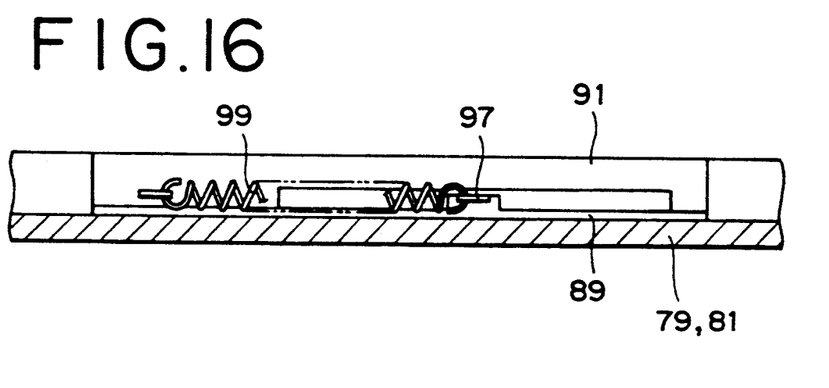
FIG. 16 is a longitudinal sectional view of the rod member biasing means of FIG. 15.

As shown in the enlarged sectional views of FIGS. 13 and 14, slots 93 are formed in opposite end portions of the rod members 91 to slidably receive therein pin members 95, which have respective screw portions threaded into the guide member 79 or 81 to retain the rod members 91 in the grooves 85. Each one of the rod members 91 is provided with laterally extending projections 97 which are biased in one direction by springs 99 in the spring receiving recess 89 as shown in the enlarged fragmentary plan and sectional views in FIGS. 15 and 16. One end of each rod member 91 is thus protruded out of the guide member 79 or 81 under the influence of the biasing force of the spring 99 when no external pressure is applied thereto.

Referring again to FIGS. 10 and 11, the guide members 79 and 81 each have a bracket 101 fixed to their base end by screws. After fitting the opposite side edges of the printed wiring board 73 in part of the guide grooves 83 on the guide members 79 and 81, the brackets 101 are fixed to the printed wiring board 73 by means of screws to fix the guide members 79 and 81 thereon in a projected state. Further, a support member 105 with a through hole 103 is bridged between the paired guide members 79 and 81 and fixed to the latter by means of screws to prevent positional deviations of the paired guide members.

A wiring alteration means 107 is fixed to the guide members 79 and 81 by screws on the side away from the support member 105. Terminals of the connector members 75 and 77 of the test connector 71, which are normally electrically connected with each other in a one-on-one fashion, can be selectively connected or disconnected in various ways by insertion of the wiring alteration means 107. This is because there might arise a necessity for disconnecting or changing the connection of the wires depending upon the nature of the test to be conducted.

Thus, when the electronic circuit unit 27 is coupled with the test connector 71 prior to insertion into the shelf 11, the anti-misplacement projection 33 (upper or lower projection in some cases) on the surface plate 31 of the electronic circuit unit 27 is advanced to enter a groove or grooves 85 and abut against the end face of a corresponding rod member 91 upon inserting the electronic circuit unit 27 along the guide grooves 83 on the paired guide members 79 and 81, electrically coupling the connector member 29 on the electronic circuit unit 27 with the connector member 77 on the test connector 71.

Next, the test connector 71, which is coupled with the electronic circuit unit 27, is inserted into a mounting position on the shelf 11 as shown in FIG. 1. At this time, the opposite side edges of the printed wiring board 71 are guided by the corresponding guide grooves 19 as the fore ends of the rod members 91, which are protruded from the guide members 79 and 81 (in this case all of the rod members 91 are protruded under the influence of the biasing force of the springs 99), reach the frame member 21.

In this instance, if the electronic circuit unit 27 which is coupled with the test connector 71 is of the type to be mounted on the inserted position on the shelf 11, the rod member 91 which is in abutting engagement with the anti-misplacement projection 33 of the electronic circuit unit 27 is allowed to pass through the anti-misplacement groove 25 (while other rod members are pushed back by abutment against the frame member 21), coupling the connector member 75 of the test connector 71 with the connector member 15 on the backboard 17 to establish electric connection therebetween for various tests.

On the other hand, in case the electronic circuit unit 27 which is connected to the test connector 71 is not of the type to be mounted in the inserted position on the shelf 11, the rod member 91 in abutting engagement with the anti-misplacement projection 33 of the electronic circuit unit 27 is not allowed to pass through the anti-misplacement groove 25 thereby prohibiting placement of the test connector 71.

Figure 17:
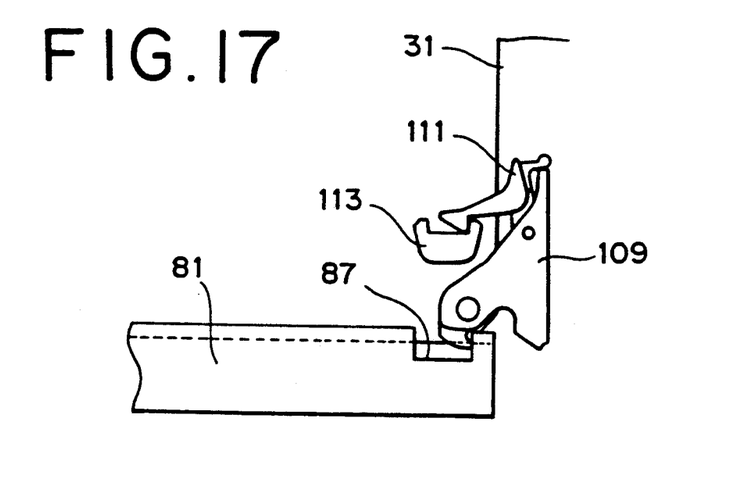
FIG. 17 is an illustration of a lock mechanism in another embodiment of the invention.
Figure 18:
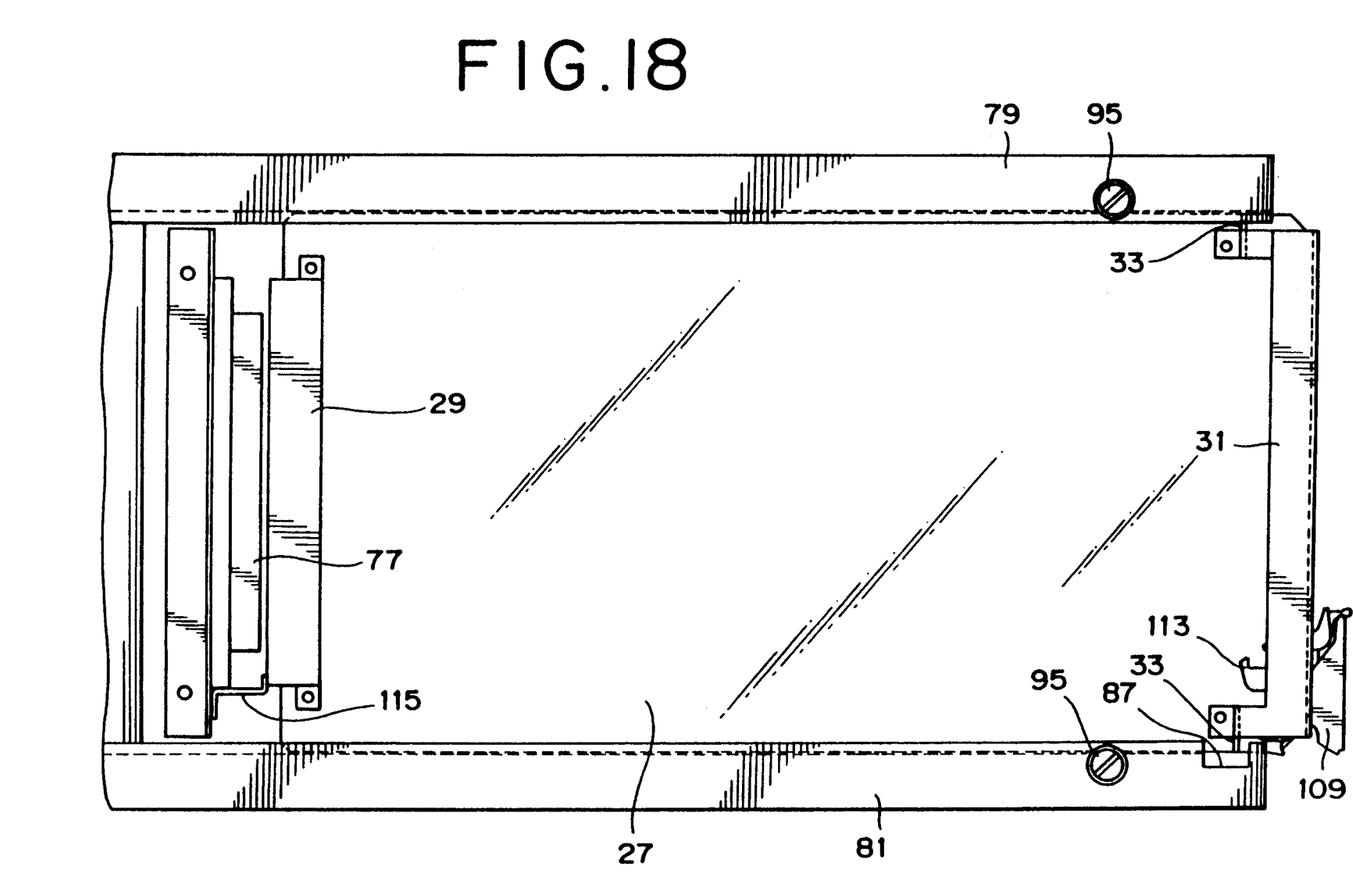
FIG. 18 is a side view of an electronic circuit unit being coupled with a test connector in the embodiment of the invention of FIG. 17.

In this case, the fore end of the rod member 91 which is in engagement with the anti-misplacement projection 33 on the electronic circuit unit 27 is pushed back by abutment against the frame member 21. This might cause spontaneous uncoupling of the electronic circuit unit 27 from the test connector 71, so that it is preferable to provided a lock mechanism for locking and releasing the electronic circuit unit 27 in the coupled position on the test connector 71. FIGS. 17 and 18 show an example of such lock mechanism, including a lever 109 which is pivotally mounted on the printed wiring board of the electronic circuit unit 27 and provided with a locking pawl 111 to be engaged with a coupling portion 113 on the printed wiring board of the electronic circuit unit 27 when mounted on the test connector 71 by abutment of part of the lever 109 against a notch 87 formed on the guide member 81. Upon turning the lever 109, part of this lever comes into engagement with the notch 87 on the guide member 81 to lock the electronic circuit unit 27 in the coupled position.

In case the electronic circuit unit 27 is coupled with a test connector 71 which is not mounted on a shelf 11, it is easy to check up by eye inspection that the connector member 29 of the electronic circuit unit 27 is of the type which matches the connector member 77 on the part of the test connector 71, and therefore it is very unlikely to insert an electronic circuit unit 27 with a connector member of a type which does not match the connector member 77. However, since the possibility of misplacement of this sort is not zero, it is preferable to provide a blocking member 115 in the vicinity of the connector member 77 of the test connector 71 as shown in FIG. 18. This arrangement is useful in case the connector member 77 is smaller than the connector member 29 in size.

There may be a case where the test connector 71 alone is mounted on the shelf 11 before connecting an electronic circuit unit 27 thereto. In such a case, as the rod members 91 are protruded from the guide members 79 and 81 under the influence of the biasing action of the spring 99, the rod member 91 in the position confronting the anti-misplacement groove 25 on the frame member 21 of the shelf 11 is allowed to pass through the anti-misplacement groove 25, while other rod members 91 are pushed back by abutment against the frame member 21. Therefore, one can easily recognize, by eye inspection, which one of the rod members 91 has passed through the anti-misplacement groove 25, and thus can easily find an electronic circuit unit 27 of an incorrect type for that mounting position.

Figure 19:
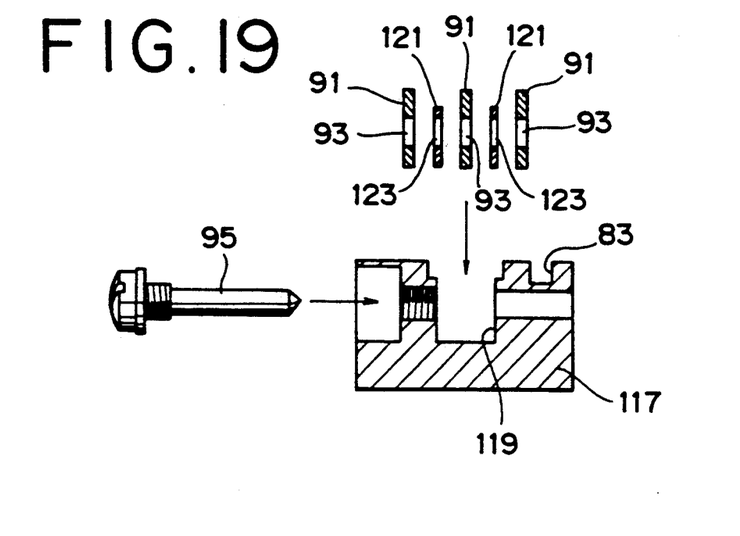
FIG. 19 is an exploded view of a guide member of modified construction in another embodiment of the invention.

FIG. 19 shows another embodiment of the guide members 79 and 81 in an exploded view. In place of the guide members 79 and 81 which are formed with grooves 85 corresponding to the rod members 91 for retaining the latter slidably thereon, this embodiment employs guide members 117 each having a relatively broad channel 119 to receive therein rod members 91 along with plate-like spacer members 121 each with an aperture 123. The rod members 91 and interposed space members 121 are retained in the channel 119 by a pin member 95 with a screw portion which is threaded into the guide member 117 through the slot 93 in each rod member 91 and the aperture 123 in each spacer member 121. As compared with the guide members 79 and 81 of the foregoing embodiment, this arrangement facilitates the fabrication process.

The above-described embodiment still cannot always prevent a possibility of mechanical damage caused by mismatching of connector types between the connector member 77 on the test connector 71 and the connector member 15 on the shelf 11 when the test connector 71 alone is mounted on the shelf 11 prior to insertion of an electronic circuit unit 27. The following description deals with a countermeasure in this regard, with reference to FIGS. 20 to 25.

Figure 20:
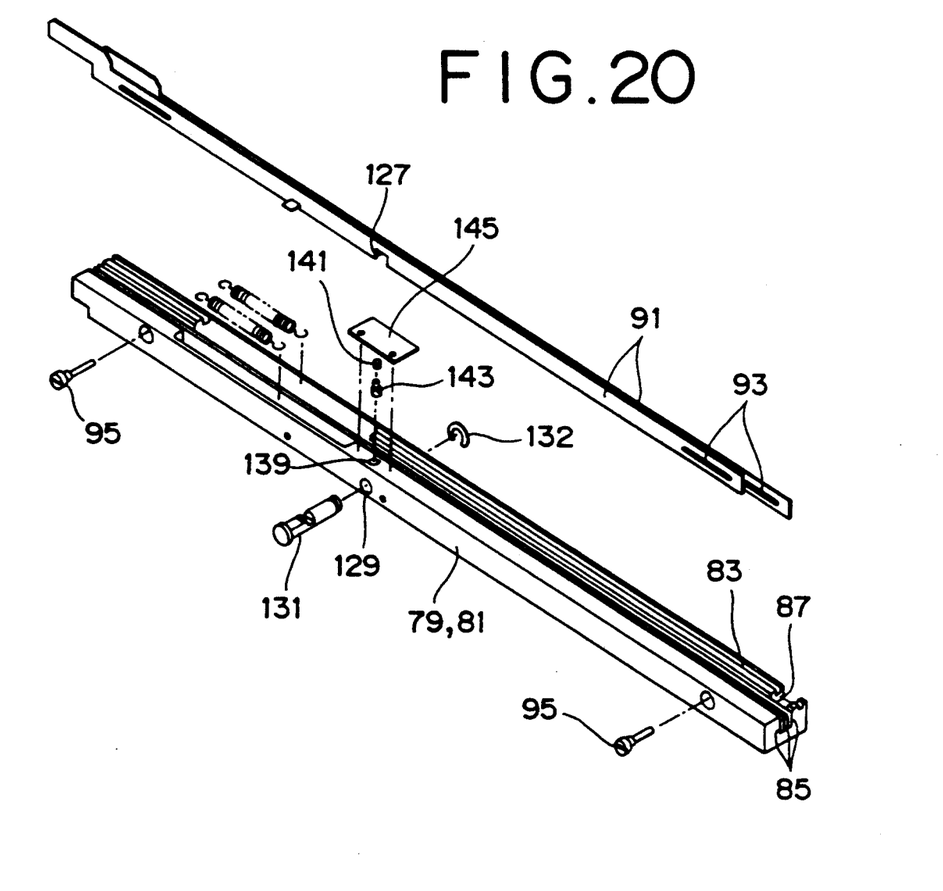
FIG. 20 is an exploded perspective view of major components of a test connector in a further embodiment of the invention.
Figure 21:
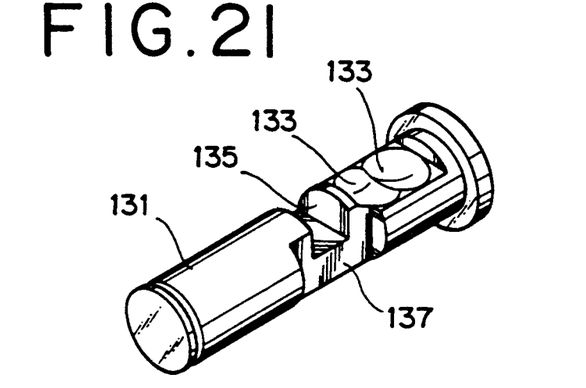
FIG. 21 is a perspective view of a pin member in the embodiment of the invention of FIG. 20.

Illustrated in FIG. 20 is an arrangement in which the guide members 79 and 81 of the foregoing embodiment are adapted to be selectively fixed, with the respective fore ends in protruded state. More specifically, the rod members 91 (a pair of rod members in the particular example shown), which are received in the guide members 79 and 81, are each provided with a notch 127 in an intermediate portion. On the other hand, the guide members 79 and 81 are provided with a through hole 129 in an intermediate portion to receive slidably therein a selector pin 131 which is provided with a stopper 132 at the inner end thereof. As shown particularly in FIG. 21, the selector pin 131 is provided with a couple of sunken portions 133 and notched portions 135 and 137. The guide members 79 and 81 are provided with a hole 139 substantially at right angles with the through hole 129 to receive a spring 141 and a presser pin 143 under a stopper plate 145 which is fixed in position by screws.

Figure 22:
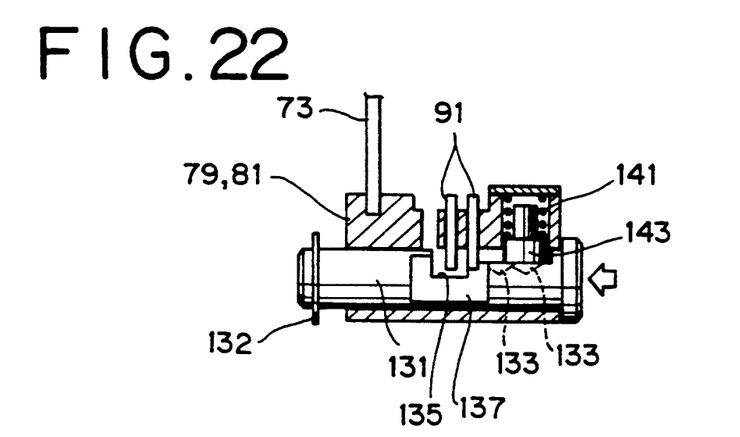
FIGS. 22 and 23 are cross-sectional views illustrative of the construction of a selective fixation means in the embodiment of the invention of FIG. 20.
Figure 24:
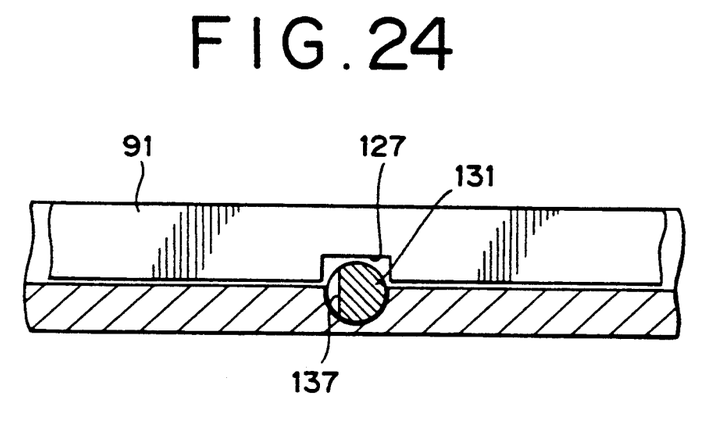
FIGS. 24 and 25 are longitudinal sectional views illustrative of the construction of the selective fixation means in the embodiment of the invention of FIG. 20.

As shown in FIG. 22, the fore end of the presser pin 143 is pressed against one of the sunken portions 133 on the selector pin 131 under the influence of the biasing action of the spring 141. When the selector pin 131 is slid by pressing one end thereof, the notch 137 on the selector pin 131 comes into a position interfering with the notch 127 on a rod member 91 as shown in FIG. 24, fixing one rod member 91 in the protruded position.

Figure 25:
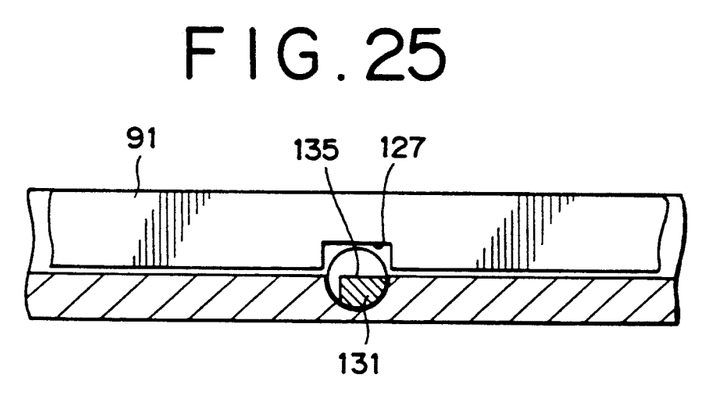

The other rod member 91, which is located in the notch 135 of the selector pin 131, can slide freely, that is, can slide free of the interfering action of the selector pin 131 as shown in FIG. 25.

Figure 23:
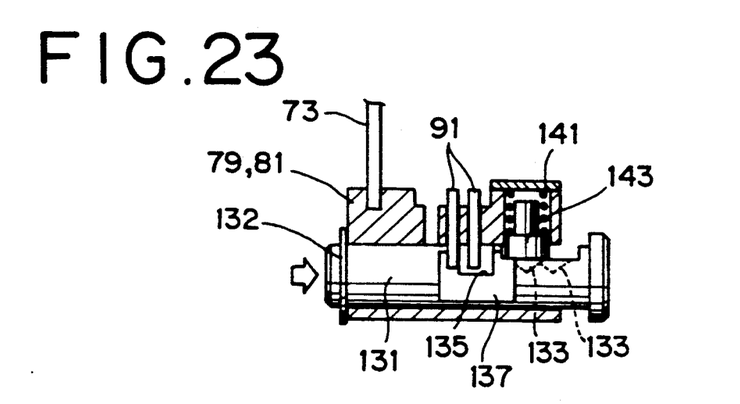

In order to set free one rod member 91 and fix the other in a reversed way, the selector pin 131 is slid in the opposite direction by pushing in the other end of the selector pin 131 as shown in FIG. 23.

The above-described selective fixation means, which is capable of suitably and selectively fixing the rod members 91, prevents mounting of the test connector 71 in an incorrect position when it is solely mounted on the shelf 11.

Figure 26:
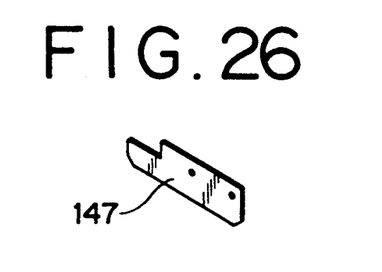
FIG. 26 is a perspective view of a projection member in still another embodiment of the invention.

Although of lesser versatility than the above-described selective fixation means, FIG. 26 shows a simpler countermeasure in this regard, including a projection member 147 which is fixedly provided at one end of each of the guide members 79 and 81. Misplacement of the test connector 71 alone can thus be suitably prevented by positional deviation of the fore end of the projection member 147 relative to the anti-misplacement groove 25 on the shelf 11.

As explained in the foregoing description, the present invention provides a test connector which can securely prevent its misplacement, and reduce electrical and mechanical troubles when disconnectibly coupling an electronic circuit unit 27 with a mounting shelf of a computer, electronic exchanger or other electronic apparatus for testing purposes.

We claim:
1. A test connector for an electronic circuit unit (27) to be used on a shelf (110 of an electronic apparatus, said shelf (11) containing unit insertion spaces each having a pair of guide grooves (19) for guiding opposite side edges of said electronic circuit unit (27), a plurality of connectors (15) located in an inner portion, and a plurality of grooves (25) provided in the vicinity of a frame portion (21) at the entrance of each of said unit insertion spaces, said electronic circuit unit (27) having a projection (33) in opposing relation to some of said grooves (25) and being allowed to enter said unit insertion space only when said projection (33) is in alignment with one of said grooves (25), characterized in that said test connector comprises:
   a printed wiring board (45) adapted to be inserted along said guide grooves (19) on said shelf (11);
   a first connector (47) attached to one end of said board (45) for coupling engagement with one of said connectors (15) on said shelf (11);
   a second connector (49) attached to an opposite end of said board (45) for coupling engagement with a connector (29) on said electronic circuit unit (27);
   a pair of guide members (51, 53) having guide grooves (55, 65) to guide the opposite side portions of said electronic circuit unit (27), said guide members (51, 53) being attached to said board (45) adjacent the opposite end thereof; and a plurality of rod members (61, 63) slidably provided in the vicinity of and substantially in parallel relation with the guide groove (55) on at least one of said guide members, one of said rod members (61, 63) being adapted to be moved by said projection (33) when said electronic circuit unit (27) is inserted into the guide grooves (55, 65) of said guide member (51, 53), engagement of said first connector (47) with one of said connectors (15) provided on said shelf (11) and engagement of said second connector (49) with said connector (29) provided on said electronic circuit unit (27) being permitted only when said projection (33) is in alignment with one of said grooves (25) and therefore one of said members (61, 63) moved by said projection (33) being permitted to enter into one of said grooves (25).

2. A test connector for an electronic circuit unit as defined in claim 1, wherein at least one rod member is located along each one of said pair of guide grooves of said guide members.

3. A test connector for an electronic circuit unit as defined in claim 1, wherein a projection member is fixedly provided at an end of at least one of said guide members, permitting placement of said test connector on said shelf only when a projected end of said projection member is in alignment with said groove on said shelf.

4. A test connector for an electronic circuit unit as defined in claim 1, further comprising biasing means urging said rod members to protrude toward said shelf.

5. A test connector for an electronic circuit unit as defined in claim 1, further comprising wires connected to said connector members of said test connector and wiring alteration means connected to said wires, said wiring alteration means being adapted to selectively disconnect or change connection of said wires between said connector members.

6. A test connector for an electronic circuit unit (27) to be used on a shelf (11) of an electronic apparatus, said shelf (11) containing unit insertion spaces each having a pair of guide grooves (19) for guiding opposite side edges of said electronic circuit unit (27), a plurality of connectors (15) located in an inner portion, and a plurality of grooves (25) provided in the vicinity of a frame portion (21) at the entrance of each of said unit insertion spaces, said electronic circuit unit (27) having a projection (33) in opposing relation to some of said grooves (25) and being allowed to enter said unit insertion space only when said projection (33) is in alignment with one of said grooves (25), characterized in that said test connector comprises:

a printed wiring board (45) adapted to be inserted along said guide grooves (19) on said shelf (11);

a first connector (47) attached to one end of said board (45) for coupling engagement with one of said connectors (15) on said shelf (11);

a second connector (49) attached to an opposite end of said board (45) for coupling engagement with a connector (29) on said electronic circuit unit (27);

a pair of guide members (51, 53) having guide grooves (55, 65) to guide the opposite side portions of said electronic circuit unit (27), said guide members (51, 53) being attached to said board (45) adjacent the opposite end thereof;

a plurality of rod members (61, 63) slidably provided in the vicinity of and substantially in parallel relation with the guide groove (55) on at least one of said guide members, one of said rod members (61, 63) being adapted to be moved by said projection (33) when said electronic circuit unit (27) is inserted into the guide grooves (55, 65) of said guide member (51, 53), engagement of said first connector (47) with one of said connectors (15) provided on said shelf (11) and engagement of said second connector (49) with said connector (29) provided on said electronic circuit unit (27) being permitted only when said projection (33) is in alignment with one of said grooves (25) and therefore one of said members (61, 63) moved by said projection (33) being permitted to enter into one of said grooves (25); and a selective fixation means for selectively fixing at least one of said rod members with one end thereof in a protruded state.

7. A test connector for an electronic circuit unit (27) to be used on a shelf (11) of an electronic apparatus, said shelf (11) containing unit insertion spaces each having a pair of guide grooves (19) for guiding opposite side edges of said electronic circuit unit (27), a plurality of connectors (15) located in an inner portion, and a plurality of grooves (25) provided in the vicinity of a frame portion (21) at the entrance of each of said unit insertion spaces, said electronic circuit unit (27) having a projection (33) in opposing relation to some of said grooves (25) and being allowed to enter said unit insertion space only when said projection (33) is in alignment with one of said grooves (25), characterized in that said test connector comprises:

a printed wiring board (45) adapted to be inserted along said guide grooves (19) on said shelf (11);

a first connector (47) attached to one end of said board (45) for coupling engagement with one of said connectors (15) on said shelf (11);

a second connector (49) attached to an opposite end of said board (45) for coupling engagement with a connector (29) on said electronic circuit unit (27);

a pair of guide members (51, 53) having guide grooves (55, 65) to guide the opposite side portions of said electronic circuit unit (27), said guide members (51, 53) being attached to said board (45) adjacent the opposite end thereof; and a plurality of rod members (61, 63) slidably provided in the vicinity of and substantially in parallel relation with the guide groove (55) on at least one of said guide members; and wherein each of said rod members is provided with a slot extending in its sliding direction, and a pin member is slidably passed through said slot and fixed to said guide member.

8. A test connector for an electronic circuit unit as defined in claim 7, wherein said at least one guide member is provided with an open channel substantially parallel with said guide groove, said channel receiving therein said rod members, adjacent rod members having a partition member with an aperture therebetween, said pin member being slidably fitted in said slots of said rod members and said apertures in said partition members.

* * * * *